(12) United States Patent
Oh et al.

(10) Patent No.: US 8,258,696 B2
(45) Date of Patent: Sep. 4, 2012

(54) LIGHT EMITTING DISPLAY AND METHOD OF MANUFACTURING THE SAME

(75) Inventors: Min-ho Oh, Yongin (KR);
Yoon-Hyeung Cho, Yongin (KR);
Byoung-duk Lee, Yongin (KR);
So-young Lee, Yongin (KR); Sun-young Lee, Yongin (KR); Won-jong Kim, Yongin (KR); Yong-tak Kim, Yongin (KR); Jin-baek Choi, Yongin (KR);
Jong-hyuk Lee, Yongin (KR);
Seung-han Lee, Yongin (KR)

(73) Assignee: Samsung Mobile Display Co., Ltd., Gyunggi-do (KR)

(*) Notice: Subject to any disclaimer, the term of this patent is extended or adjusted under 35 U.S.C. 154(b) by 195 days.

(21) Appl. No.: 12/607,864

(22) Filed: Oct. 28, 2009

(65) Prior Publication Data

US 2010/0045177 A1 Feb. 25, 2010

Related U.S. Application Data

(63) Continuation-in-part of application No. 12/215,610, filed on Jun. 27, 2008.

(30) Foreign Application Priority Data

Jun. 28, 2007 (KR) .................. 10-2007-0064293
Oct. 29, 2008 (KR) .................. 10-2008-0106222

(51) Int. Cl.
*H01J 33/00* (2006.01)

(52) U.S. Cl. .................. 313/512; 313/113; 313/506

(58) Field of Classification Search .................. None
See application file for complete search history.

(56) References Cited

U.S. PATENT DOCUMENTS 5,734,225 A 3/1998 Biebuyck et al.
6,473,148 B1 10/2002 Suh
6,605,826 B2 8/2003 Yamazaki et al.
(Continued)

FOREIGN PATENT DOCUMENTS

CN 1798710 4/2004
(Continued)

OTHER PUBLICATIONS

Office Action dated Jul. 17, 2009 for corresponding application CN 2008101319108.

(Continued)

*Primary Examiner* — Ashok Patel
(74) *Attorney, Agent, or Firm* — Knobbe, Martens, Olson & Bear, LLP (57) ABSTRACT

The present invention is to provide an organic light emitting display and a method of manufacturing the same. The light emitting display according to the present invention includes: a first substrate on which a plurality of light emitting devices having first electrodes, organic light emitting layers, and second electrodes are disposed; a second substrate disposed to face the first substrate; a dam member disposed between the first substrate and the second substrate to surround the plurality of light emitting devices; an inorganic sealing material disposed between the first substrate and the second substrate in an outer area of the dam member and attaching the first substrate to the second substrate; and a silicon filling material provided between the first substrate and the second substrate inward of the dam member to be in contact with the second electrodes.

14 Claims, 4 Drawing Sheets

U.S. PATENT DOCUMENTS

| | | |
|---|---|---|
| 6,791,660 B1 | 9/2004 | Hayashi et al. |
| 6,878,467 B2 | 4/2005 | Chung et al. |
| 7,109,655 B2 | 9/2006 | Kurihara |
| 7,112,115 B1 | 9/2006 | Yamazaki et al. |
| 7,128,632 B2 | 10/2006 | Nakamura |
| 7,834,550 B2 | 11/2010 | Lee et al. |
| 2001/0048234 A1 | 12/2001 | Liu et al. |
| 2001/0050532 A1 | 12/2001 | Eida et al. |
| 2003/0042852 A1 | 3/2003 | Chen |
| 2003/0122476 A1 | 7/2003 | Wang et al. |
| 2004/0095060 A1 | 5/2004 | Ushifusa et al. |
| 2004/0207314 A1 | 10/2004 | Aitken et al. |
| 2005/0023976 A1 | 2/2005 | Wang |
| 2005/0040762 A1 | 2/2005 | Kurihara |
| 2005/0110404 A1 | 5/2005 | Park et al. |
| 2005/0260440 A1 | 11/2005 | Seo et al. |
| 2005/0269940 A1 | 12/2005 | Nishikawa et al. |
| 2006/0082298 A1 | 4/2006 | Becken et al. |
| 2006/0202220 A1 | 9/2006 | Hayashi |
| 2007/0052347 A1 | 3/2007 | Kurihara |
| 2007/0170861 A1 | 7/2007 | Lee et al. |
| 2007/0194710 A1 | 8/2007 | Song et al. |
| 2009/0009046 A1 | 1/2009 | Oh et al. |
| 2009/0102357 A1* | 4/2009 | Koyama ........................ 313/504 |
| 2010/0045181 A1 | 2/2010 | Oh et al. |

FOREIGN PATENT DOCUMENTS

| | | |
|---|---|---|
| DE | 102005044523 | 3/2007 |
| GB | 2 383 683 | 7/2003 |
| JP | 11-195484 | 7/1999 |
| JP | 2000-068050 | 3/2000 |
| JP | 2002-158088 | 5/2002 |
| JP | 2002-280169 | 9/2002 |
| JP | 2003-203763 | 7/2003 |
| JP | 2003-217830 | 7/2003 |
| JP | 2004-027404 | 1/2004 |
| JP | 2004-095416 | 3/2004 |
| JP | 2005-019300 | 1/2005 |
| JP | 2005-285573 | 10/2005 |
| JP | 2006-156150 | 6/2006 |
| JP | 2006-221906 | 8/2006 |
| JP | 2006-236726 | 9/2006 |
| JP | 2006-252885 | 9/2006 |
| JP | 2007-140061 | 6/2007 |
| KR | 1020030024996 | 3/2003 |
| KR | 1020030057053 | 7/2003 |
| KR | 1020050112318 | 11/2005 |
| KR | 1020060021379 | 3/2006 |
| KR | 100671647 | 1/2007 |
| WO | WO 2004/095597 | 11/2004 |

OTHER PUBLICATIONS

U.S. Appl. No. 12/215,610, filed Jun. 27, 2008, Oh et al., 2009-0009046, Office Action dated Sep. 29, 2010.

Extended European Search Report dated Feb. 8, 2011 for corresponding EP Application No. 08252229.3.

* cited by examiner

LIGHT EMITTING DISPLAY AND METHOD OF MANUFACTURING THE SAME

CROSS-REFERENCE TO RELATED APPLICATIONS

This application is a continuation-in-part of U.S. application Ser. No. 12/215,610 filed Jun. 27, 2008 which claims the benefit of Korean Patent Application No. 10-2007-0064293 filed Jun. 28, 2007 in the Korean Intellectual Property Office, the entire contents of which are incorporated by reference herein. This application also claims the benefit of Korean Patent Application No. 10-2008-0106222, filed on Oct. 29, 2008, in the Korean Intellectual Property Office, the entire content of which is incorporated herein by reference.

BACKGROUND

1. Field of the Invention

The present invention relates to a light emitting display and a method of manufacturing the same, and more particularly to a light emitting display having a silicon filling material between a substrate on which a light emitting device is formed and a sealing substrate, and a method of manufacturing the same.

2. Discussion of Related Art

Since a light emitting device such as an organic light emitting diode (OLED) includes organic materials vulnerable to moisture and/or oxygen, it is required to protect the OLED against moisture and/or oxygen.

Since a light emitting display using an OLED typically has a wide viewing angle, high contrast and response speed, and low power consumption, in spite of its vulnerability to moisture and/or oxygen, light emitting displays are widely used in personal portable equipment, such as MP3 players, mobile telephones, and televisions (TV). Light emitting displays have been slimmer in accordance with the requests of users.

However, when the thickness of a substrate of a light emitting display is reduced to about 0.3 mm or less in order to reduce the overall thickness of the light emitting display, it is difficult to maintain the mechanical integrity of the device under stresses such as falling and twisting. Loss of mechanical integrity can compromise the sealed state of the device, thereby reducing the life of the organic light emitting display.

SUMMARY OF THE INVENTION

Accordingly, it is an object to provide a light emitting display capable of securing mechanical reliability and of durability and a method of manufacturing the same.

It is another object to provide a light emitting display capable of securing mechanical reliability by using an inorganic sealing material that effectively prevents the infiltration of moisture or oxygen and a method of manufacturing the same.

In order to achieve the foregoing and/or other objects, according to one aspect of the present invention, there is provided a light emitting display including: a first substrate on which a plurality of light emitting devices having first electrodes, organic light emitting layers, and second electrodes are disposed; a second substrate disposed to face the first substrate; a dam member disposed between the first substrate and the second substrate to surround the plurality of light emitting devices; an inorganic sealing material disposed between the first substrate and the second substrate in an outer area of the dam member and attaching the first substrate to the second substrate; and a silicon filling material provided between the first substrate and the second substrate inward of the dam member to be in contact with the second electrodes.

In order to achieve the foregoing and/or other objects, according to another aspect of the present invention, there is provided a method of manufacturing a light emitting display including: providing a first substrate on which a plurality of light emitting devices comprising first electrodes, organic light emitting layers, and second electrodes are disposed; providing a second substrate; forming an inorganic sealing material along an outer area in the second substrate; forming a dam member on the second substrate inside the inorganic sealing material and surrounding the plurality of light emitting devices; dropping a liquid-phase silicon filling material inside the dam member; disposing the first substrate and the second substrate to face each other so that the silicon filling material becomes in contact with the second electrodes and fills a space inside the dam member; attaching the inorganic sealing material to the first substrate and the second substrate to seal the plurality of light emitting devices; and hardening the silicon filling material.

The present invention as described above seals the light emitting devices using an inorganic sealing material effectively preventing hydrogen or oxygen from penetrating and fill space between the substrates with a silicon filling material to improve pressure resistance. The silicon filling material has a high stability as it does not react to the material of the light emitting device. Further, it maintains pressure resistance between the substrates to allow the sealed state not to be easily broken by means of impact or the like. Therefore, the mechanical reliability is improved so that the life of the light emitting display can be increased, and a passivation film for protecting a cathode electrode is omitted so that the manufacturing process can be simplified.

Also, in typical light emitting displays, since the space between the substrate and the sealing substrate is empty, the substrate may droop to cause the generation of Newton's ring or the displays may be vulnerable to impact. On the other hand, in the light emitting display according to the present invention, the space between the substrate and the sealing substrate is filled with a filling material having a similar refractivity to the glass substrate, thereby preventing Newton's ring and having improved visibility.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, exemplary embodiments of the present invention will be described in detail with reference to the accompanying drawings. However, the embodiments set forth herein are provided so that those skilled in the art can fully understand the present invention and thus, the present invention can be embodied in different forms and should not be construed as limited to the embodiments set forth herein.

In order to increase the life of an organic light emitting display, it is effective to use an inorganic sealing material that effectively prevents moisture and/or oxygen from penetrating. However, the inorganic sealing material is easily separated by means of impact or warp to deteriorate mechanical reliability.

Therefore, the present invention provides a light emitting display which is increased in life and improved in mechanical reliability by using an inorganic sealing material that effectively prevents moisture and/or oxygen from penetrating and a method of manufacturing the same.

Figure 1:
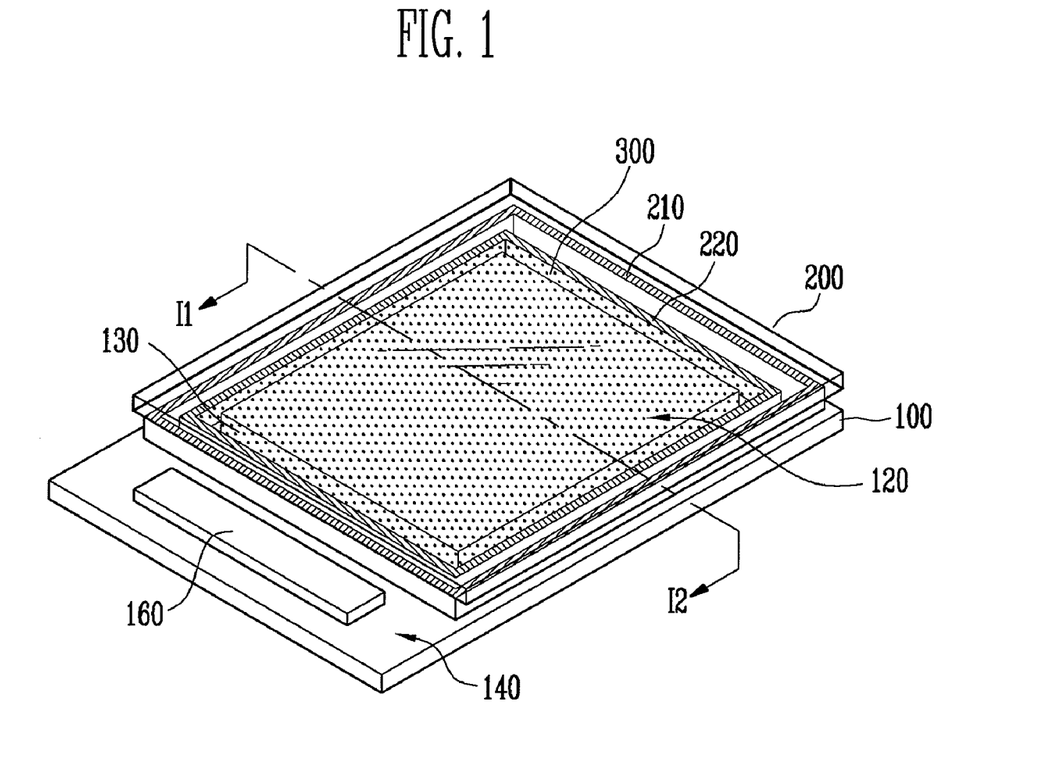
FIG. 1 is a perspective view illustrating a light emitting display according to the present invention.
Figure 2:
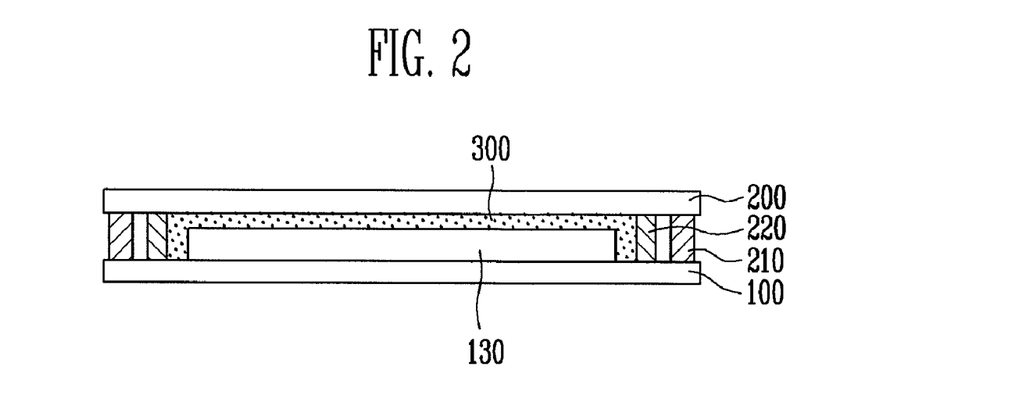
FIG. 2 is a cross-sectional view taken along line I1-I2 of FIG. 1.

FIG. 1 is a perspective view illustrating a light emitting display according to the present invention, and FIG. 2 is a cross-sectional view taken along line I1-I2 of FIG. 1.

Referring to FIGS. 1 and 2, the light emitting display of the present invention includes a substrate 100 on which a plurality of light emitting devices 130 are formed, a sealing substrate 200 facing the substrate 100, a dam member 220 provided between the substrate and the sealing substrate 200 to surround the plurality of light emitting devices 130, an inorganic sealing material 210 provided outside the dam member 220 between the substrate 100 and the sealing substrate 200 and attaching the substrate 100 to the sealing substrate 200, and a silicon filling material 300 provided inside the dam member 220 between the substrate 100 and the sealing substrate 200.

The substrate 100 is defined as a pixel region 120 and a non-pixel region 140 around the pixel region 120. The plurality of light emitting devices 130 are formed in the pixel region 120, and a driving circuit 160 for driving the plurality of light emitting devices 130 is formed in the non-pixel region 140.

Figure 3:
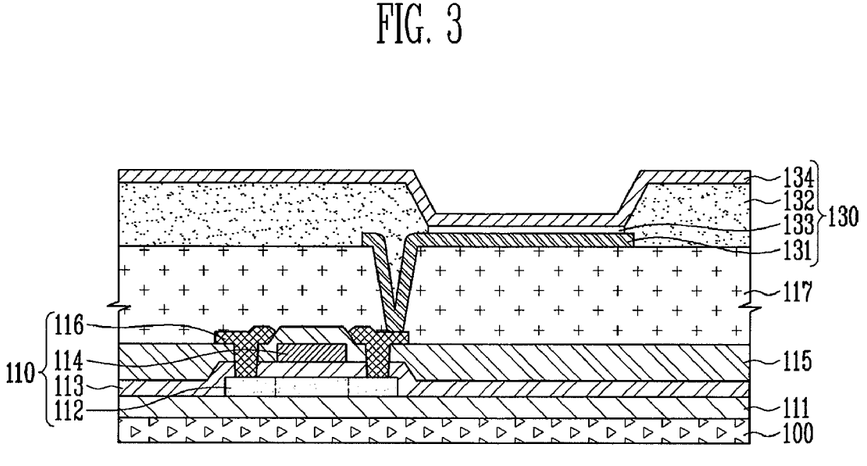
FIG. 3 is a cross-sectional view of the light emitting device of FIG. 1.

Referring to FIG. 3, the light emitting device 130, for example, may be formed of an organic light emitting display that includes an anode electrode 131, a cathode electrode 134 and an organic light emitting layer 133 formed between the anode electrode 131 and the cathode electrode 134. The organic light emitting layer 133 is formed in a light emitting region (a region where the anode electrode 131 is exposed) defined by a pixel definition layer 132 and may include a hole injection layer, a hole transport layer, an electron transport layer and an electron injection layer.

Also, a thin film transistor for controlling the operation and a capacitor for maintaining a signal may be coupled to the light emitting device 130. The thin film transistor 110 includes a semiconductor layer 112 providing a source and drain region and a channel region, a gate electrode 114 insulated from the semiconductor layer by a gate insulating layer 113, and a source and drain electrode 116 coupled to the semiconductor layer 112 in the source and drain region through a contact hole formed on the insulating layer 115 and the gate insulating layer 113. Reference numerals 111 and 117, not explained, are a buffer layer and a planarization layer, respectively.

The sealing substrate 200 is disposed to overlap with the pixel region 120 and a part of the non-pixel region 140. In the case of a front emission type of display, the sealing substrate 200 can be formed of a transparent material such as glass. In the case of a rear emission type, the sealing substrate can be formed of an opaque material.

The inorganic sealing material 210 includes frit, which is melted by a laser or infrared rays to be attached to the substrate 100 and the sealing substrate 200. The inorganic sealing material 210 is provided between the substrate 100 and the sealing substrate 200 to surround the light emitting device 130 so that moisture or oxygen penetration from the outside is prevented.

The dam member 220 prevents the filling material 300 from flowing so that the shape of the filling material 300 is maintained. The dam member 220 is provided to prevent heat from being transmitted to the light emitting devices 130 when the inorganic sealing material 210 is attached to the substrate 100 and the sealing substrate 200 and formed of an inorganic material or an organic material.

The inorganic material includes frit. In this case, frit that transmits or reflects a laser or infrared rays is used or a reflecting layer is formed on the surface of the dam member 220 using metal having a high reflectance in the infrared region, e.g., Au, Ag, Pt, and/or Al, so that a laser or Infrared rays is reflected. In addition, as an organic material, at least one selected from the group consisting of epoxy, epoxy acrylate, and silicones (e.g., bisphenol A type epoxy, cycloaliphatic epoxy resin, phenyl silicone resin or rubber, acrylic epoxy resin, etc. and).

The dam member 220 may be formed to be in contact with the inorganic sealing material 210 or may be parallel separated from the inorganic sealing material 210 by a predetermined distance. For example, the dam member 220 may be formed to be in contact with the inorganic sealing material 210 when including an inorganic material, while it may be separated from the inorganic sealing material 210 by about 50 μm or more when including an organic material. If the dam member 220 of an organic material is in contact with the inorganic sealing material 210, it may be decomposed by heat when the inorganic sealing material 210 is attached to the substrate 100 and the sealing substrate 200 to generate out gas.

The silicon filling material 300 is provided to fill an inward space between the substrate 100 and the sealing substrate 200 defined by the dam member 220. The silicon filling material 300 is a colorless (transparent) material having a transmittance of not less than 90% in a visible region, such as a glass substrate, so that visibility does not deteriorate. Also, the silicon filling material 300 has a high stability in view of chemistry so that it does not react to a material forming the light emitting devices 130, in particular, the cathode electrode 134 formed of a metal material.

In order to protect the cathode electrode 134 after the light emitting device 130 is formed as shown in FIG. 3, an organic or inorganic passivation film (not shown) should be formed on the cathode electrode 134. In this case, an additional process is required and the display increases in thickness. However, since the present invention uses the filling material 300 which does not react to a metal material, it can be implemented to have a structure where the cathode electrode 134 is exposed, making it possible to simplify the process and structure thereof.

Hereinafter, a method of manufacturing a light emitting display according to the present invention will be described in detail.

Figure 4A:
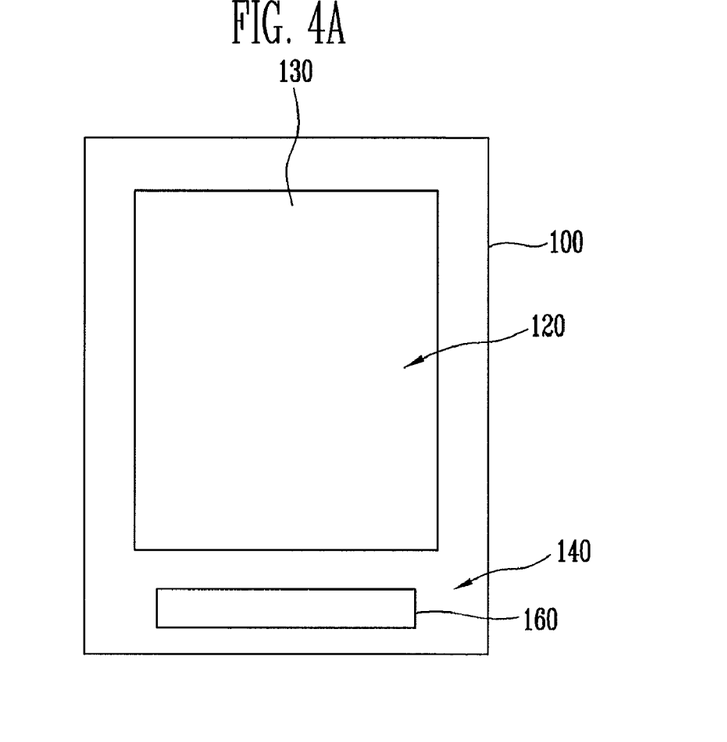
FIGS. 4A and 4B are plan views illustrating a method of manufacturing the light emitting display according to the present invention.
Figure 4B:
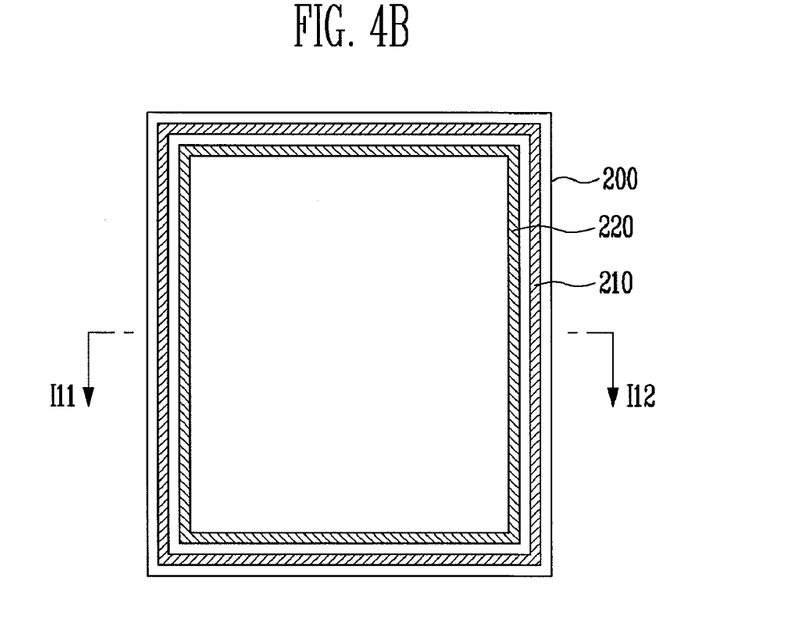

FIGS. 4A and 4B are plan views illustrating a method of manufacturing the light emitting display according to the present invention. FIGS. 5A to 5F are cross-sectional views illustrating the method of manufacturing the light emitting display according to the present invention. FIGS. 5A to 5D are cross-sectional views taken along line I11-I12 of FIG. 4B.

Referring to FIG. 4A, first, the substrate 100 on which the plurality of light emitting devices 130 are formed is provided. The substrate 100 is divided into the pixel region 120 and the non-pixel region 140 around the pixel region 120. The plurality of light emitting devices 130 are formed in the pixel region 120 of the substrate, and the driving circuit 160 for driving the light emitting devices 130 are formed in the non-pixel region 140.

Referring to FIG. 3, the light emitting devices 130 include an organic light emitting device having the anode electrodes 131, the organic light emitting layers 133, and the cathode electrodes 134. Also, the light emitting devices 130 may further include thin film transistors (TFT) 110 for controlling the operation of the organic light emitting device and capacitors (not shown) for maintaining signals. A process of manufacturing the organic light emitting device is illustrated in the Korean Patent Publications No. 2002-0047889 (published on Jun. 22, 2002) and No. 2003-0092873 (published Dec. 6, 2003).

Figure 5A:
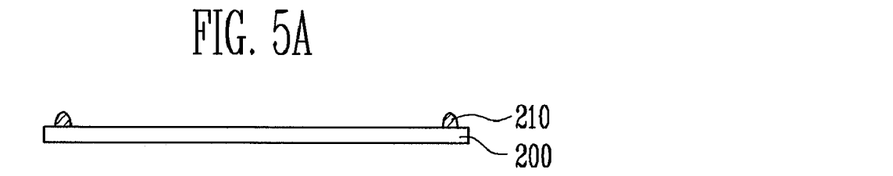
FIGS. 5A to 5F are cross-sectional views illustrating a method of manufacturing the light emitting display according to the present invention.

Referring to FIGS. 4B and 5A, the sealing substrate 200 for sealing the light emitting devices 130 of the pixel region 120 is provided. The sealing substrate 200 may overlap with the pixel region 120 and a part of the non-pixel region 140. A transparent substrate such as glass having the front emission structure or an opaque substrate having the rear emission type can be used as the sealing substrate 200.

An inorganic sealing material 210 is disposed along the edge of the sealing substrate 200. The inorganic sealing material 210 is formed by applying frit using a dispenser or using a screen printing method. Frit commonly means a powder-type glass material. However, as used herein, frit refers to paste containing a laser or infrared-ray absorbing material, an organic binder, and a filler to reduce a thermal expansion coefficient, in a main material such as SiO2. The organic binder and moisture are removed from the paste frit via a drying or annealing process so that the paste frit is hardened. The laser or infrared-ray absorbing material can include a transition metal compound, for example, a vanadium compound. After the inorganic sealing material 210 is disposed on the sealing substrate 200, a washing process can be followed.

Figure 5B:
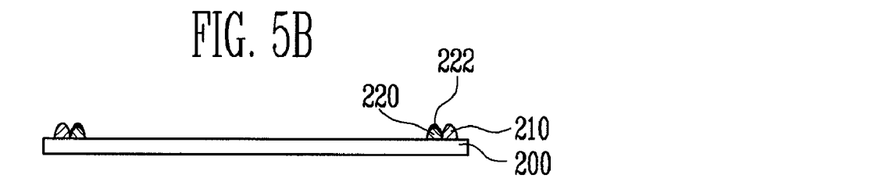
Figure 5C:
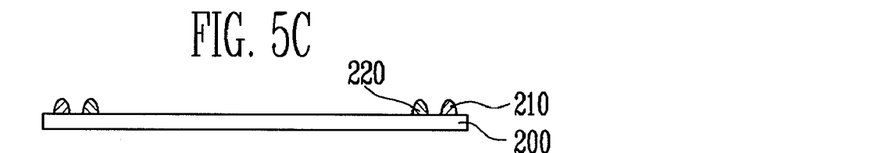

Referring to FIGS. 4B, 5B, and 5C, the dam member 220 is formed on the sealing substrate 200 on the inward side of the inorganic sealing material 210 to surround the pixel region 120. The dam member 220 may be formed by applying an inorganic material or an organic material by dispensers or by screen printing. At this time, the amount of the inorganic material or organic material is determined in consideration of the distance from the light emitting devices 130 disposed in the outermost region of the pixel region to the inorganic sealing material 210 and the height of the dam member 220. The height of the dam member 220 may be determined by the height of the inorganic sealing material 210 and is preferably the same or less than the height of the inorganic sealing material 210.

Frit can be used as the inorganic material. In this case, the dam member 220 can be formed in a process of forming the inorganic sealing material 210. Frit that transmits or reflects a laser or infrared rays is used or a reflecting layer 222 is disposed on the surface of the dam member 220 in order to reflect a laser or ultraviolet rays as illustrated in FIG. 5B. For example, after applying the paste frit, the paste frit is dried or annealed, and hardened to form the dam member 220. Then, a metal such as Au, Ag, Pt, or Al having a high reflectance in the ultraviolet-rays region is applied onto the surface of the dam member 220 to form the reflecting layer 222. In addition, the organic material can be at least one selected from the group consisting of epoxy, epoxy acrylate, and silicones (e.g., bisphenol A type epoxy, cycloaliphatic epoxy resin, phenyl silicone resin or rubber, acrylic epoxy resin, etc.).

The dam member 220 may be formed to be in contact with the inorganic sealing material 210, as illustrated in FIG. 5B, or to be separated from the inorganic sealing material 210 by a predetermined distance, as illustrated in FIG. 5C. For example, when being formed of an inorganic material, the dam member 220 can be in contact with the inorganic sealing material 210. In this case, the area of the non-pixel region can be reduced. In addition, when being formed of an organic material, the dam member 220 is preferably separated from the inorganic sealing material 210 by 50 μm or more. Since the organic material typically has low viscosity to be easily applied, it may be easily collapsed by stress such as a pressure difference. Therefore, the dam member 220 is formed and then is pre-hardened to be solid in structure, the dam function can be reinforced. Therefore, the dam member 220 can be pre-hardened by heat, an electron beam, or ultraviolet rays in accordance with the kind of the organic material so that the dam member 220 is not damaged by the stress in a process of attaching the substrate 100 to the sealing substrate 200.

In another embodiment, in a process of forming the inorganic sealing material 210 or the dam member 220, a dummy sealing material (not shown) can be formed of epoxy and frit on the outermost edge of the sealing substrate 200. The dummy sealing material is formed on the outside of the sealing material 210 to collectively seal up the space between the substrate 100 and the sealing substrate 200. In the case of a mother substrate, the dummy sealing material is disposed along the outermost edge thereof.

Figure 5D:
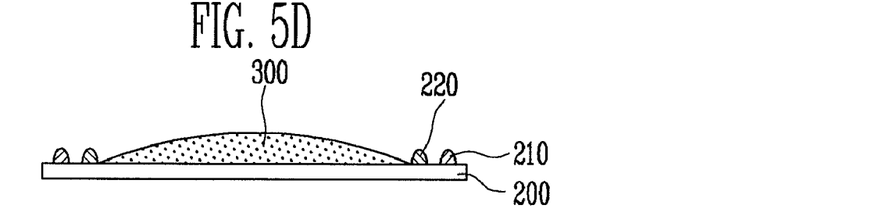

Referring to FIG. 5D, the liquid silicon filling material 300 is provided on the sealing substrate 200 in the inward region defined by the dam member 220. The silicon filling material 300 is a colorless (transparent) material having a transmittance of 90% or more in a visible-ray region such as a glass substrate, so that it does not deteriorate visibility. Also, the silicon filling material 300 has a high stability in view of chemistry not to react to a material forming the light emitting devices 130, in particular, the cathode electrode 134 formed of a metal material.

The silicon filling material 300 can be provided by inkjetting, a dispenser, screen printing, one drop filling (ODF), or the like. For example, the silicon filling material 300 having a viscosity of 1 to 200 cPs may be stacked on the sealing substrate on the internal side of the dam member 220. In this case, the proper amount of the filling material 300 in proportion to the volume of the internal space can be easily controlled.

Figure 5E:
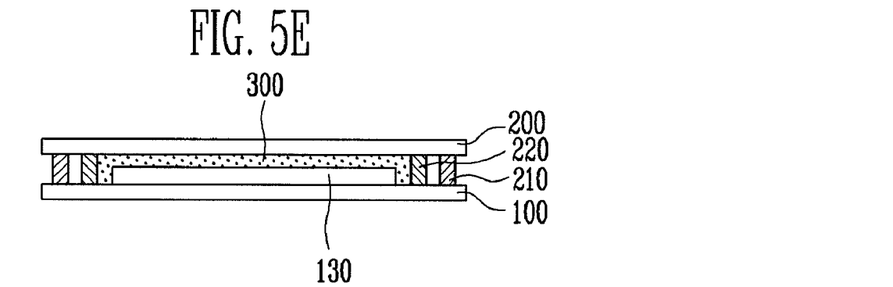

Referring to FIG. 5E, the substrate 100 is disposed to face the sealing substrate 200. For example, after the substrate 100 is mounted on an upper chuck of an attaching device and the sealing substrate 200 is mounted on a lower chuck of the attaching device, the substrate 100 and the sealing substrate 200 are attached to each other. As the substrate 100 and the sealing substrate 200 are attached to each other, the silicon filling material 300 is contacted with the cathode electrode 134 to fill a space inside the dam member 220 and is prevented from flowing by the dam member 220 so that the shape is maintained. At this time, the substrate 100 and the sealing substrate 200 are attached to each other under a pressure lower than atmospheric pressure so that bubbles or voids are not formed between the substrate 100 and the sealing substrate 200. In addition, the substrate 100 and the sealing substrate 200 are pressed together so that the space between the light emitting devices 130 and the sealing substrate 200 is completely filled with the filling material 300.

Figure 5F:
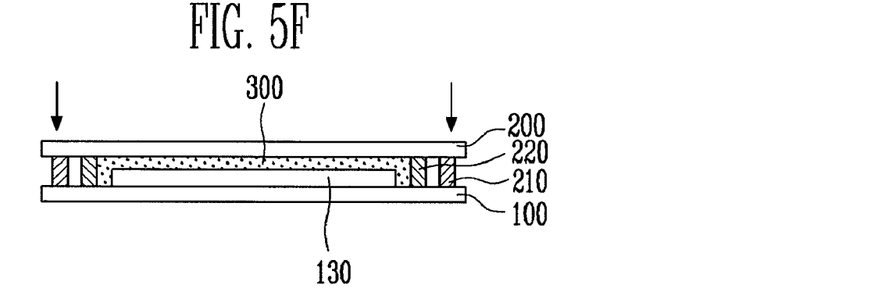

Referring to FIG. 5F, a laser or infrared rays are irradiated along the inorganic sealing material 210 with the substrate 100 and the sealing substrate 200 being attached to each other. As the laser or infrared rays are absorbed to generate heat, the inorganic sealing material 210 is attached to the substrate 100 and the sealing substrate 200 by melting, so that the light emitting devices 130 are sealed. Such a sealing process is preferably performed after the dummy sealing material is hardened so that the space between the substrate 100 and the sealing substrate 200 becomes a vacuum.

When a laser or infrared rays are irradiated along the inorganic sealing material 210, a mask or a passivation film (not shown) is used to irradiate a laser or infrared rays to only a desired region. When the dam member 220 includes an inorganic material that transmits or reflects a laser or infrared rays, or when the reflecting layer 222 is formed on the surface of the dam member 220, the mask or the passivation film is disposed only in the pixel region 120 so that a laser or infrared rays are not irradiated. When the dam member 220 includes an organic material, the mask or the passivation film is disposed in the pixel region 120 and the non-pixel region 140 where the dam member 220 is formed so that a laser or infrared rays do not irradiate.

Assuming that a dam member 220 is not formed, since heat generated in irradiating a laser or infrared rays is easily transmitted to the silicon filling material 300, the temperature can suddenly rise to cause damage to the light emitting devices 130. However, in the present invention, the transmission of heat is effectively reduced or prevented by the dam member 220, thereby making it possible to maintain the region filled with the silicon filling material 300 and the shape thereof as they are.

Thereafter, the silicon filling material 300 is hardened using heat, an electron beam or ultraviolet rays. At this time, since an out gas may be generated from the silicon filling material 300, the proportion of a composition (vinyl polymer, H-polymer, hardening catalyst, anti-hardening agent or the like) is controlled during the preparing process of the silicon filling material 300 not to generate the out gas at the time of hardening.

The above embodiment has been described with the inorganic sealing material 210 sealing only the pixel region 120 but does not limit the present invention. In other embodiments, the inorganic sealing material 210 can further seal the driving circuit 160. In addition, according to the above embodiment, the inorganic sealing material 210 and the dam member 220 are formed in a single structure on the sealing substrate 200. In other embodiments, the inorganic sealing material and the dam member can be formed in a double or multiple structure on the substrate 100. For example, the inorganic sealing material 210 may be formed in a double or multiple structure in order to improve a sealing effect, or the dam member 220 may be formed in a double or multiple structure in order to improve a heat shielding effect.

In addition, according to the above embodiment, the filling material 300 is filled before attaching the substrate 100 and the sealing substrate 200 to each other. However, the filling material 300 can be filled after the substrate 100 and the sealing substrate 200 are attached to each other depending on material or characteristics the material. Also, in the embodiment, the inorganic sealing material 210 is attached to the substrate 100 and the sealing substrate 200, and then the silicon filling material 300 is hardened. However, the silicon filling material 300 can be hardened before the inorganic sealing material 210 is attached to the substrate 100 and the sealing substrate 200.

As an experimental example, when the silicon filling material 300 is filled using the ODF process and thermally hardened at a temperature of 100° C. or less, no defects in light emitting are observed even if the silicon filling material 300 is exposed to a high temperature of 85° C. and a high humidity of 85% for 428 hours.

While the present invention has been described in connection with certain exemplary embodiment, it is to be understood that the invention is not limited to the disclosed embodiment, but, on the contrary, is intended to cover various modifications and equivalent arrangements included within the spirit and scope of the appended claims, and equivalents thereof.

What is claimed is:

1. A light emitting display comprising:
    a first substrate on which a plurality of light emitting devices comprising first electrodes, organic light emitting layers, and second electrodes are disposed;
    a second substrate disposed to face the first substrate;
    a dam member disposed between the first substrate and the second substrate to surround the plurality of light emitting devices;
    an inorganic sealing material disposed between the first substrate and the second substrate in an outer area of the dam member and attaching the first substrate to the second substrate; and
    a silicon filling material provided between the first substrate and the second substrate inward of the dam member to be in contact with the second electrodes.

2. The light emitting display as claimed in claim 1, wherein the dam member comprises an inorganic material.

3. The light emitting display as claimed in claim 2, wherein the inorganic material comprises frit.

4. The light emitting display as claimed in claim 2, wherein a reflecting layer that reflects a laser and/or infrared rays is disposed on a surface of the dam member.

5. The light emitting display as claimed in claim 4, wherein the reflecting layer comprises at least one selected from the group consisting of Au, Ag, Pt, and Al.

6. The light emitting display as claimed in claim 2, wherein the dam member is disposed to be in contact with the inorganic sealing material.

7. The light emitting display as claimed in claim 1, wherein the dam member comprises an organic material.

8. The light emitting display as claimed in claim 7, wherein the organic material comprises at least one selected from the group consisting of epoxy, epoxy acrylate, bisphenol A type epoxy, cycloaliphatic epoxy resin, phenyl silicone resin, or rubber, and acrylic epoxy resin.

9. The light emitting display as claimed in claim 7, wherein the dam member is disposed to be spaced away from the inorganic sealing material.

10. The light emitting display as claimed in claim 9, wherein the dam member and the inorganic sealing material are spaced away from each other by 50 μm or more.

11. The light emitting display as claimed in claim 1, wherein the inorganic sealing material comprises frit.

12. The light emitting display as claimed in claim 11, wherein the frit is formed from a material configured to be melted by application of one or more of a laser and infrared rays to the frit.

13. The light emitting display as claimed in claim 12, wherein the frit comprises a transition metal compound.

14. The light emitting display as claimed in claim 1, wherein the inorganic sealing material is inhibited from contact with the silicon filling material by the dam member.

* * * * *